(12) United States Patent
Deimling

(10) Patent No.: US 6,339,332 B1
(45) Date of Patent: Jan. 15, 2002

(54) METHOD FOR THE OPERATION OF A NUCLEAR MAGNETIC RESONANCE TOMOGRAPHY APPARATUS FOR SEPARATING WATER AND FAT SIGNALS

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/365,904

(22) Filed: Aug. 3, 1999

(30) Foreign Application Priority Data

Aug. 12, 1998 (DE) .......................... 198 36 612

(51) Int. Cl.$^7$ ............................ G01V 3/00; G01R 33/20
(52) U.S. Cl. .......................... 324/309; 324/307
(58) Field of Search ............................ 324/309, 307, 324/312, 313, 314, 306; 600/410

(56) References Cited

U.S. PATENT DOCUMENTS

| | | | |
|---|---|---|---|
| 4,739,266 A | 4/1988 | Kunz ........................ | 324/309 |
| 4,769,603 A | 9/1988 | Oppelt et al. .............. | 324/309 |
| 4,857,847 A | 8/1989 | Machida .................... | 324/311 |
| 5,270,654 A | * 12/1993 | Feinberg et al. ........... | 324/309 |
| 5,327,088 A | * 7/1994 | Pipe ......................... | 324/309 |
| 5,541,514 A | 7/1996 | Heid et al. ................. | 324/309 |

FOREIGN PATENT DOCUMENTS

EP  0 745 865  5/1996

OTHER PUBLICATIONS

Westbrook, Catherine and Kaut, Carolyn "MRI in Practice" Second Edition textbook published 1998 (interpreted as Jan. 1$^{st}$ 1998 by the examiner since no month of publication is listed) pp. 170–173.*

R. Freeman and H.D.W. Hill "Phase and Intensity Anomalies in Fourier Transform NMR" Journal of Magnetic Resonance vol. 4 pp. 366–383 1971 no month.*

* cited by examiner

*Primary Examiner*—Hezron Williams
*Assistant Examiner*—Tiffany A. Fetzner
(74) *Attorney, Agent, or Firm*—Schiff Hardin & Waite

(57) ABSTRACT

In a method for the operation of a nuclear magnetic resonance tomography apparatus for separating water and fat signals a true FISP sequence is implemented with a repetition time TR, so that fat-bonded protons experience a phase rotation of approximately n·180° due to the effect of the chemical shift relative to water-bonded protons, with n being an odd number. Dependent on the further configuration of the sequence, either fat-bonded protons or water-bonded protons exhibit only a slight magnetization in the steady state condition, and thus contribute only little to the measured signal.

3 Claims, 5 Drawing Sheets

METHOD FOR THE OPERATION OF A NUCLEAR MAGNETIC RESONANCE TOMOGRAPHY APPARATUS FOR SEPARATING WATER AND FAT SIGNALS

BACKGROUND OF THE INVENTION

1. Field of the Invention

The present invention is directed to a method for operating a nuclear magnetic resonance tomography apparatus, and in particular to such a method which allows separation of water signals and fat signals from each other.

2. Description of the Prior Art

U.S. Pat. No. 4,769,603 discloses a pulse sequence that is usually referred to with the acronym "FISP". A specific version of this pulse sequence, wherein the gradients in all spatial directions are reset before each excitation, is referred to as "True FISP Sequence". The relatively long transient time given this pulse sequence is reduced, as taught in U.S. Pat. No. 5,541,514, emitting a radio-frequency pulse having the flip angle $\alpha/2$ preceding a FISP sequence, with successive excitations having a flip angle $\alpha$.

The True FISP sequence exhibits excellent properties for MR imaging, namely high spatial resolution, short measuring time in the range of seconds, and high signal-to-noise ratio, particularly for tissue having liquid consistency.

The True FISP Sequence exhibits a strong T1/T2 weighting. Pure water having a ratio T1/T2=1 yields the maximum SSFP (Steady State Free Procession) signal MO/2 given FISP. MO represents the magnetization in the relaxed condition dependent on the proton density. Fat exhibits a T1/T2 ratio of 270:70 ms. Even though this ratio is clearly higher than that of pure water, fat still exhibits an extremely high signal intensity in the FISP sequence. For comparison, muscle tissue has a T1/T2 ratio of 12:1. In conventional sequences wherein a high signal intensity of fat is likewise disturbing, this problem is usually solved by fat saturation in a preparation phase. A spectrally selective radio-frequency pulse is emitted into the examination subject. In order to destroy the magnetization produced by this pulse, the radio-frequency pulse is enclosed by pulses known as spoiler gradient pulses. Such a preparation phase, however, lasts for a relatively long time (for example, 10 ms), and thus it is unsuitable for FISP, which has a typical repetition time TR=5 ms. Given the necessary lengthening to, for example, 15 milliseconds, pronounced artifacts would be obtained due to field inhomogeneities.

SUMMARY OF THE INVENTION

It is an object of the present invention to enable a separation of the fat and water signals in a FISP sequence.

The above object is achieved in accordance with the principles of the present invention in a method for operating a nuclear magnetic resonance tomography apparatus wherein radio-frequency pulses are emitted into an examination subject with a repetition time, in order to excite nuclear spins in the examination subject, nuclear resonance signals resulting from the nuclear spins are read out between the radio-frequency pulses under a readout gradient in a readout window, the nuclear resonance signals are phase-encoded before the readout window and the phase-encoding is reset before the next radio-frequency pulse, and wherein the repetition time is selected so that fat-bonded protons experience a phase rotation of approximately n·180° due to the effect of the chemical shift compared to water-bonded protons, wherein n is an odd number.

DESCRIPTION OF THE PREFERRED EMBODIMENTS

Figure 1:
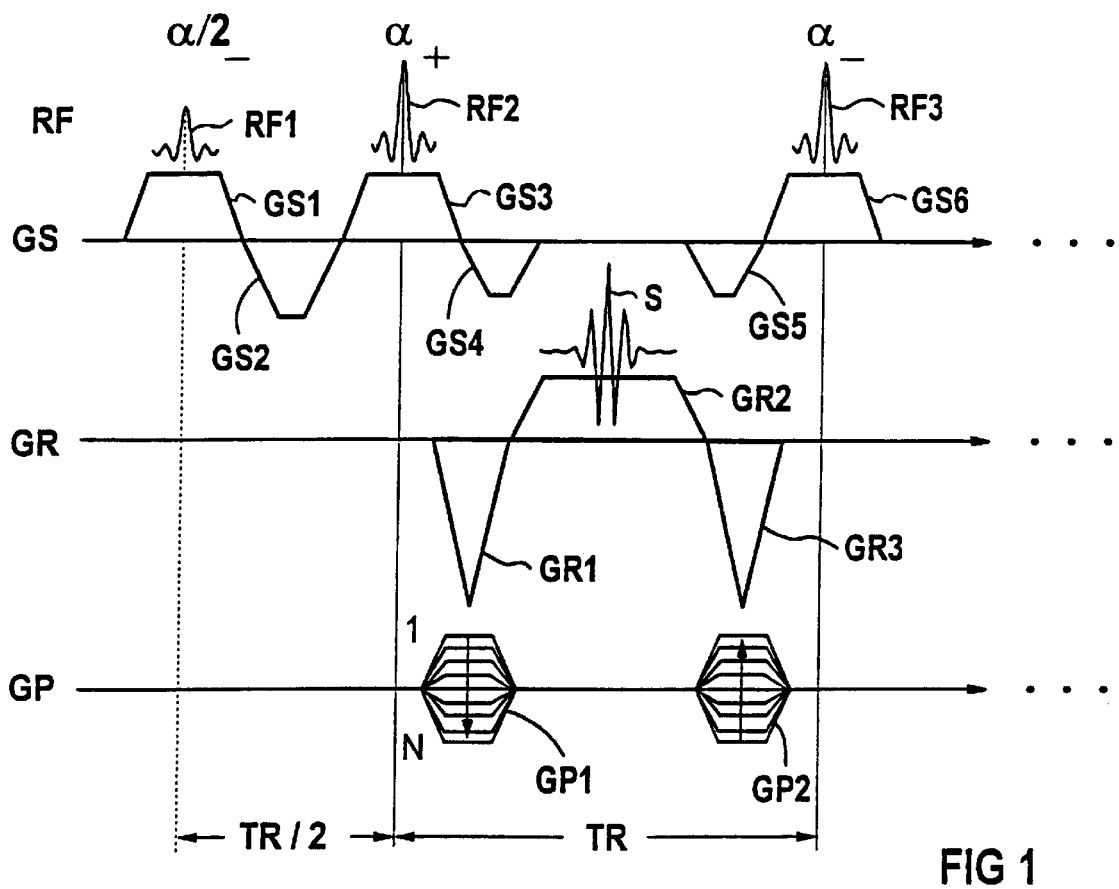
FIG. 1 shows an exemplary pulse sequence in accordance with the invention.

As an exemplary embodiment of the invention, FIG. 1 shows a pulse sequence that—with the exception of the time sequence explained below—is disclosed by U.S. Pat. No. 5,541,514. The pulse sequence begins with a radio-frequency pulse RF1 that is emitted under the influence of a slice selection gradient GS1, so that only one slice of the examination subject is excited. The dephasing caused with the slice selection gradient GS1 is in turn canceled by the oppositely directed gradient GS2. A second radio-frequency pulse RF2 that is emitted under a slice selection gradient GS3 follows. In the next step, the nuclear spins are phase-encoded by a phase-encoding gradient GP1 and are dephased in readout direction by a gradient GR1. Further, a gradient pulse GS4 directed opposite to the slice selection gradient GS3 is emitted in the slice selection direction.

In the next step, a nuclear magnetic resonance signal S is read out under a readout gradient GR2. Finally, a gradient pulse GS5 is applied in the negative slice selection direction, and a gradient pulse GR3 is emitted in the negative read out direction. The phase-encoding due to the gradient pulse GP1 is in turn reset by a gradient pulse GP2 in the opposite direction. Subsequently, a further radio-frequency pulse RF3 is emitted under a slice selection gradient GS6. As is typical of the True FISP sequence, the amplitude-time integral in all gradient directions is equal to zero between two excitations and the gradients exhibit a symmetry in every time window between two excitations.

The repetition time, i.e. the time between two excitations with radio-frequency pulses, is referenced TR in FIG. 1. The radio-frequency pulse RF1, serving as a preparation pulse, has a spacing of TR/2 from the radio-frequency pulse RF2 for reasons described in detail in the aforementioned U.S. Pat. No. 5,541,514. Further, the phase alternation of the radio-frequency pulses is critical, so that an excitation is obtained according to the relation $\alpha/2\_TR/2-[\alpha_+-TR-\alpha_--TR\ldots]n$.

Figure 2:
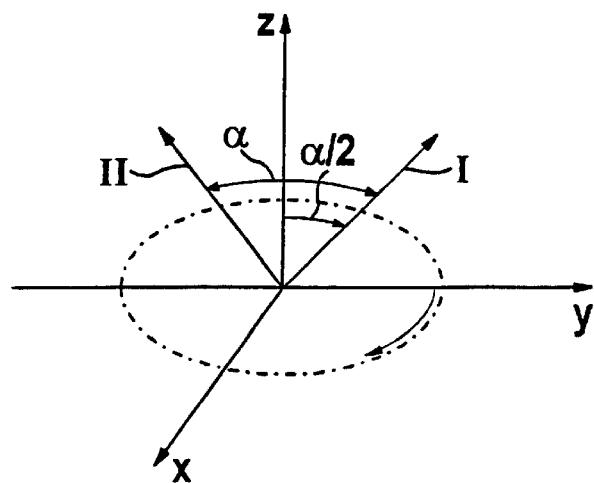
FIG. 2 is a spatial illustration of the magnetization vector.

The manner by which the above-described excitation influences the magnetization in the rotating coordinate system x, y, z is shown in FIG. 2. The magnetization vector initially is in the direction of the fundamental field, i.e. in the z-direction, and is deflected in the negative direction to the position I by the first radio-frequency pulse RF1 having the flip angle $\alpha/2$ (referred to in brief below as $\alpha/2$ pulse). A deflection by the angle $\alpha$ to the position II ensues due to the first a pulse RF2. Subsequently, the magnetization is swept back and forth between the positions I and II due to the radio-frequency pulses RF of alternating polarity. A steady state condition of the magnetization thus is obtained.

Figure 3:
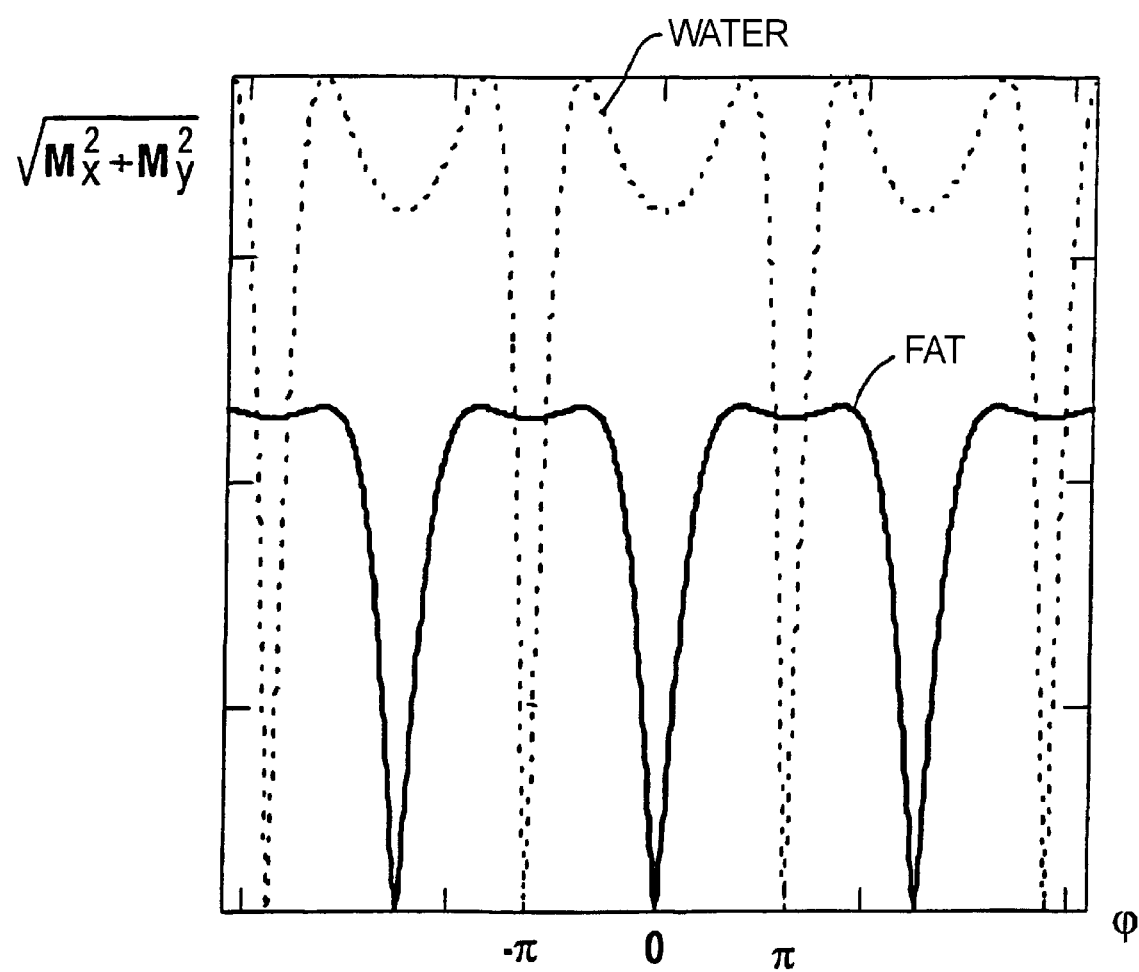
FIG. 3 shows the magnitude signal of the transverse magnetization as function of the spin dephasing.

This consideration, however, only applies as long as no dephasing of the spins occurs. The behavior of the steady state magnetization can be described as a function of the dephasing angle with the equations of Freeman and Hill that are recited in "Phase and Intensity Anomalies in Fourier Transformation NMR," Freeman et al., *Journal of Magnetic Resonance* 4, pages 366–383, 1971. FIG. 3 shows the magnitude of the transverse magnetization ($\sqrt{Mx^2+My^2}$) as function of the spin dephasing for water (broken line) and fat (solid line). Independently of the material, the signal amplitude disappears given phase-alternating radio-frequency-excitation at those locations at which the spin dephasing amounts to $\phi=n\cdot\pi$ with an uneven n. In the ideal, uniform fundamental magnetic field $B_0$, the dephasing within the repetition time TR is equal to zero, and the signal is high given phase alternation of the $\alpha$ pulses. In a real basic magnetic field with an inhomogeneity $\Delta B_)$, the spin dephasing over time amounts to $\theta(t)=2\pi\cdot\gamma\cdot\Delta B_0 T$.

The spin dephasing $\theta(t)$ produced by the field inhomogeneity viewed over the entire TR interval must be far smaller than $\pi$ so that the signal amplitude does not drop off. The demands made of the field homogeneity given True FISP sequences are thus extremely high.

However, it is not only a magnetic field inhomogeneity but also the chemical shift $\delta$ that leads to a dephasing, i.e. the shift of the resonant frequency $\omega$ due to the chemical bond. The chemical shift $\delta$ for protons that are bonded in lipid molecules has a value of approximately 3.3 ppm compared to free water, i.e. the resonant frequency $\omega$ of protons bonded in lipid molecules is $2\pi\cdot\gamma\cdot\delta B_0$ smaller than that of free water. Given a field strength $B_0=1.5$ T, this difference amounts, for example, to 210 Hz. The invention is based on selecting the repetition time TR such that the signal from the lipid molecules (i.e. fat) exhibits a phase rotation of 180° or an odd-numbered multiple of 180° compared to the signal from free water. In the illustration of FIG. 2, this corresponds to an angular rotation by 180° around the z-axis. When, as described above, phase-alternating radio-frequency pulses are emitted, then the fat molecules no longer experience any alternation of the radio-frequency due to the phase rotation by 180°. Whereas the magnetization for free water flips back and forth between the conditions referenced I and II in FIG. 2 and adequate magnetization is thus always available the magnetization of fat becomes very low after a few excitation pulses due to the 180° phase rotation.

When, on the other hand, the repetition time is selected according to the above-presented rule and no phase alternation of the excitation is implemented, then the magnetization of water, and thus the water signal, will already disappear after a few excitations. By contrast, the following situation arises for the magnetization of fat: Assume the fat magnetization initially is in condition I according to FIG. 2. At the time of the next $\alpha$ pulse (i.e., after TR), the magnetization is rotated by 180° around the z-axis due to the dephasing caused by chemical shift, i.e. into position II. Due to the $\alpha$ pulse that now follows, the magnetization is again rotated into position I, etc. Ultimately, thus, the alternation between the positions I and II occurs here for fat signals, so that these supply a high signal contribution in the steady state.

A fat image or water image thus can be obtained dependent on whether the aforementioned pulse sequence is operated with or without phase alternation of the radio-frequency excitation.

On the basis of the above particulars, a repetition time of $TR=1/(2\gamma\cdot\delta\cdot B_0)=2.4$ ms or an odd-numbered multiple thereof arises for a basic magnetic field of 1.5 T. Such repetition times can still be realized with high-performance nuclear magnetic resonance tomography systems.

Figure 6:
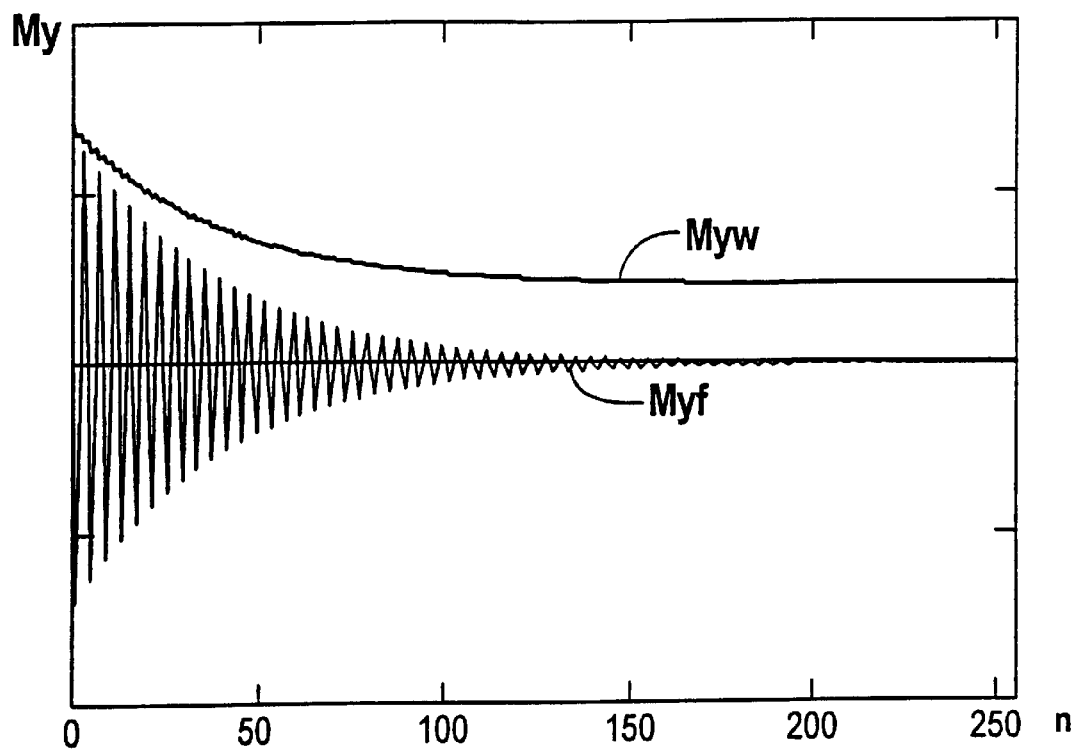
FIG. 6 shows the development over time of the y-component My of the magnetization given a repetition time TR=2.4 ms.

FIG. 6 shows how the magnetization My develops in the y-direction for fat and water when the aforementioned repetition time TR=2.4 ms is adhered to. The following were assumed as parameters:

$B_0=1.5$ T, TR=2.4 ms, $\alpha=90°$, 67 =3.3 ppm, T1=200 ms, T2=60 ms.

Figure 7:
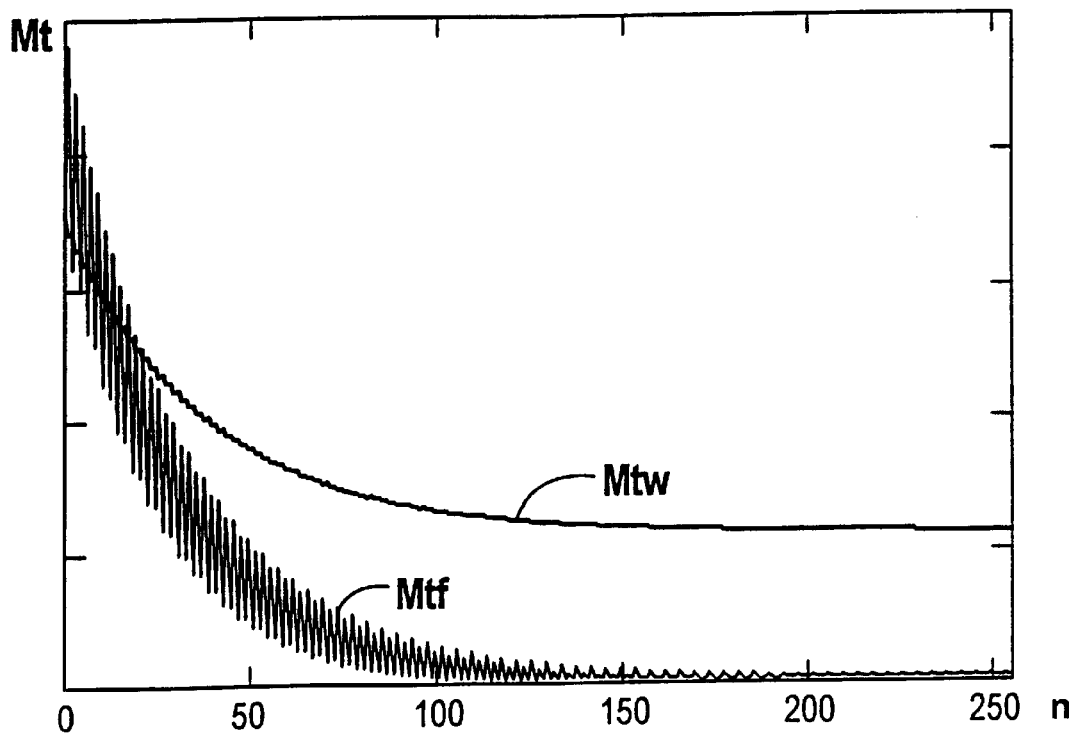
FIG. 7 shows the corresponding development over time of the transversal magnetization Mt.

One can see that the water magnetization referenced Myw reaches a steady state condition at a relatively high level. The fat magnetization referenced Myf, however, oscillates greatly after every repetition due to the 180° phase rotations and decays to zero. The same is true of the magnetization Mxf registered with the same parameters. The magnitude of the water magnetization $$Mtw=\sqrt{Myw^2+Mxw^2}$$

and the magnitude of the fat magnetization $$Mtf=\sqrt{Myf^2+Mxf^2}$$

are shown in FIG. 7, which illustrates transversal magnetization Mt.

Figure 4:
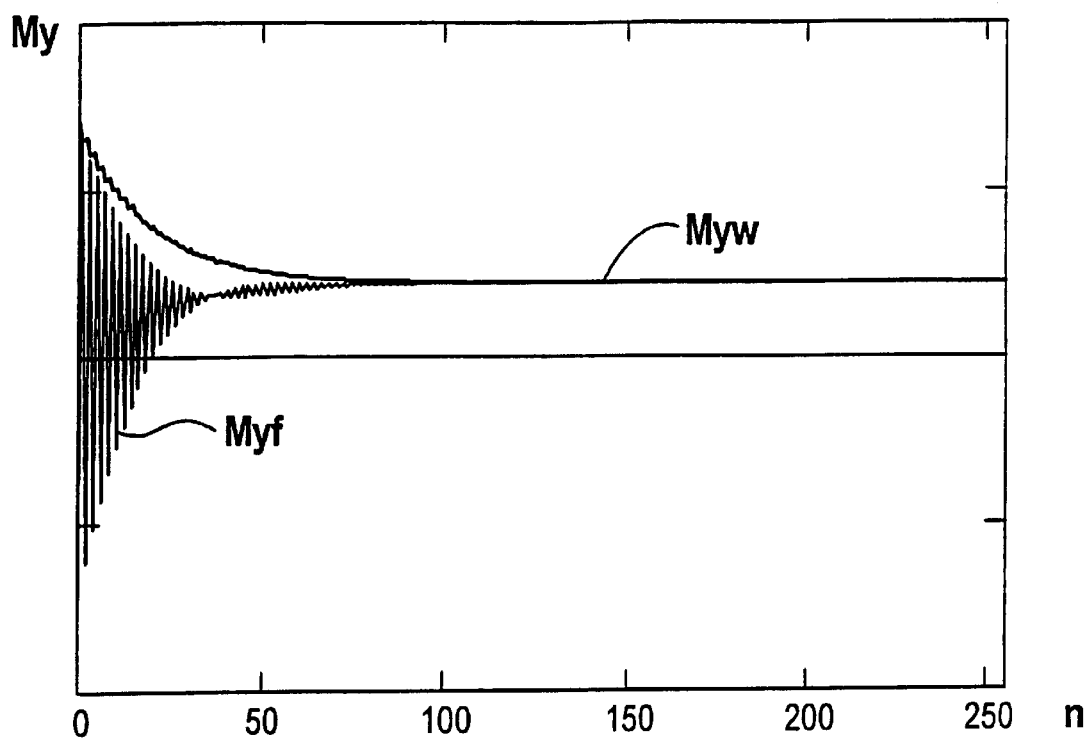
FIG. 4 shows the development over time of the y-component My of the magnetization given a repetition time TR=4.8 ms.
Figure 5:
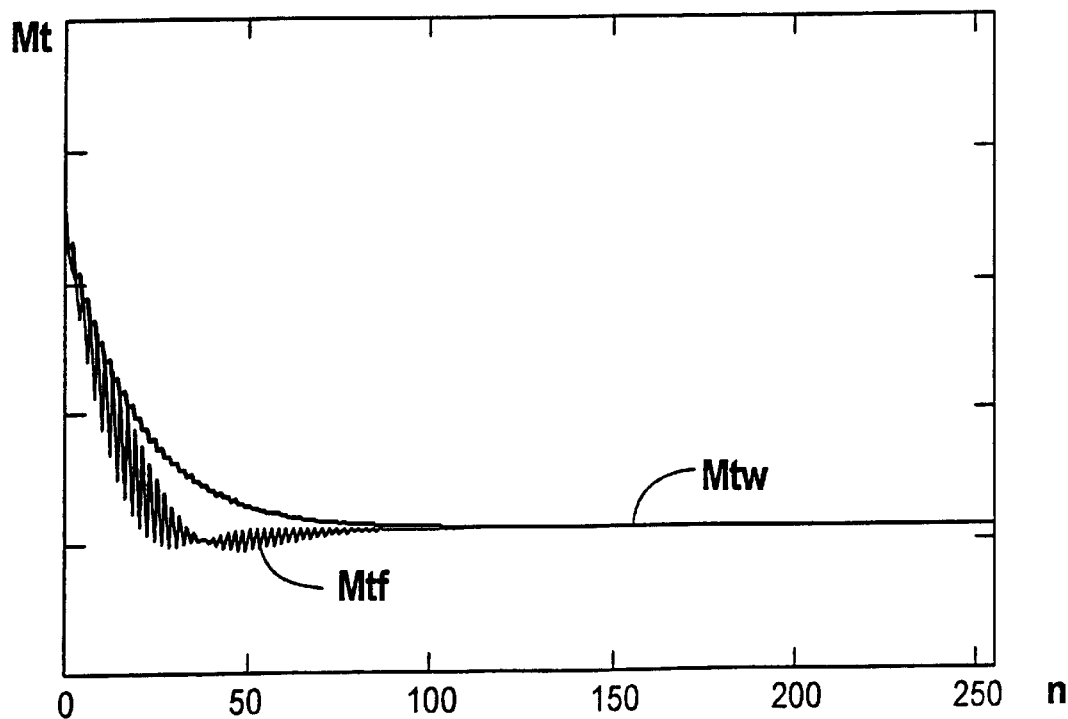
FIG. 5 shows the corresponding development over time of the transversal magnetization Mt.

For comparison, the corresponding magnetization curve when the pulse sequence is operated with a repetition time TR=4.8 ms is shown in FIG. 4 for My and in FIG. 5 for Mt. In this case, a phase rotation of the fat signals respectively ensued by 360°, so that the magnetization of the fat protons, just like that of the water protons, flips back and forth between two conditions with every repetition. Here, the magnetization Myf and Mxf of fat oscillates greatly at the start; however, it proceeds to the same steady state condition as the magnetization Myw or Mxw of water.

Figure 8:
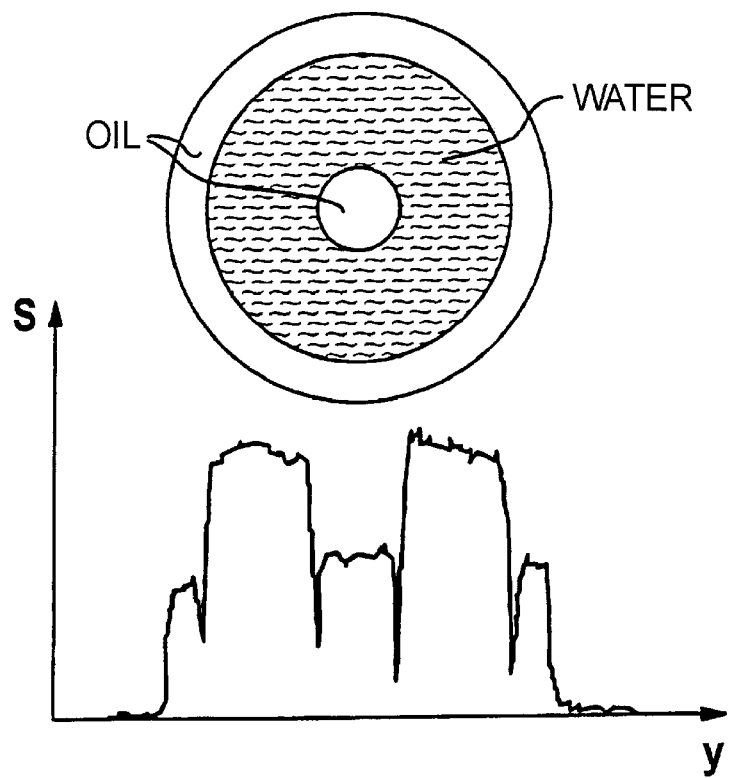
FIG. 8 is an intensity profile of an oil/water phantom without oil suppression.
Figure 9:
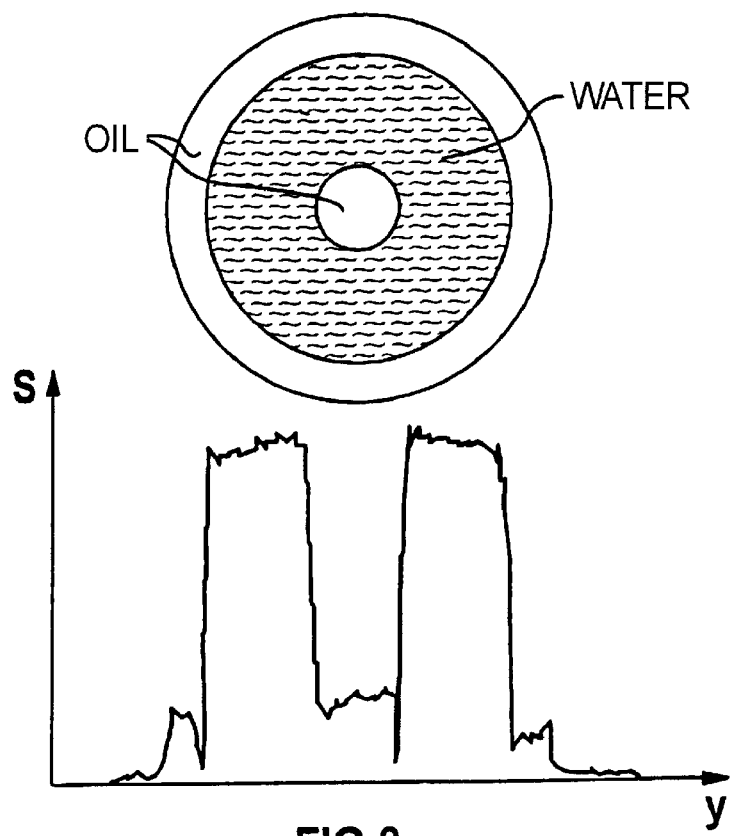
FIG. 9 is an intensity profile of an oil/water phantom with oil suppression.

For demonstrating the affect of the above-presented pulse sequence, FIGS. 8 and 9 show the intensity profiles of an oil/water phantom, without the inventive fat suppression (in this case, oil suppression) in FIG. 8 and with the inventive fat suppression in FIG. 9. The oil/water phantom has an oil-filled core in a water-filled cylinder as well as an oil-filled outside cladding. A comparison of the two diagrams shows that the signal S from the oil-filled core as well as the signal S from the oil-filled cladding have become significantly lower. MR images with clear suppression of the fat part thus are obtained in a simple way without major interventions to the system.

I claim as my invention:

1. A method for operating a nuclear magnetic resonance tomography apparatus, which generates NMR signals comprising the steps of:

emitting radio-frequency excitation pulses, with a repetition time into an examination subject containing fat-bonded protons and water-bonded protons, said radio-frequency excitation pulses exciting nuclear spins in said examination subject having a resonant frequency which exhibits a chemical shift due to said fat-bonded protons and a chemical shift due to said water-bonded protons;

reading out nuclear resonance signals produced by said nuclear spins from said examination subject between successive radio-frequency excitation pulses under a readout gradient in a readout window;

phase-encoding said nuclear resonance signals before said readout window and resetting said phase-encoding before a next radio-frequency excitation pulse following, said readout window;

selecting said repetition time so that only nuclear spins of said fat-bonded protons experience a phase rotation of approximately n 180° due to said chemical shift compared to nuclear spins of water-bonded protons, wherein n is an odd number.

2. A method as claimed in claim 1 wherein the step of emitting radio-frequency excitation pulses comprises emitting radio-frequency excitation pulses which alternate in phase from radio-frequency excitation pulse-to-radio-frequency excitation pulse.

3. A method as claimed in claim 2 wherein said radio-frequency excitation pulses have a flip angle $\alpha$, and wherein at a beginning of a sequence of said radio-frequency excitation pulses at a distance which is one-half of said repetition time preceding a first of said radio frequency excitation pulses, another radio-frequency excitation pulse is emitted with a flip angle of $\alpha/2$ with a phase which is inverted relative to said first radio-frequency excitation pulse.

* * * * *